United States Patent
Liu et al.

(10) Patent No.: US 12,400,064 B2
(45) Date of Patent: Aug. 26, 2025

(54) ROUTING OF HIGH-SPEED, HIGH-THROUGHPUT INTERCONNECTS IN INTEGRATED CIRCUITS

(71) Applicant: Synopsys, Inc., Mountain View, CA (US)

(72) Inventors: Xun Liu, Cary, NC (US); Jennifer Song Yon Pyon, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 577 days.

(21) Appl. No.: 17/889,903

(22) Filed: Aug. 17, 2022

(65) Prior Publication Data
US 2023/0061120 A1    Mar. 2, 2023

Related U.S. Application Data

(60) Provisional application No. 63/239,579, filed on Sep. 1, 2021.

(51) Int. Cl.
*G06F 30/394*    (2020.01)
(52) U.S. Cl.
CPC .................. *G06F 30/394* (2020.01)
(58) Field of Classification Search
CPC ..................................... G06F 30/394
USPC ......................................... 716/126
See application file for complete search history.

(56) References Cited

U.S. PATENT DOCUMENTS

2015/0154337 A1*  6/2015  Fang ............... G06F 30/392
                                                      716/120

* cited by examiner

*Primary Examiner* — Eric D Lee
(74) *Attorney, Agent, or Firm* — Lowenstein Sandler LLP

(57) ABSTRACT

A method includes partitioning, within an interposer IC design on which are disposed a first die and a second die, a first bump array into first cluster regions of bumps and a second bump array into second cluster regions of bumps. Creating multiple sub-channels between respective bump cluster regions. Identifying a set of trunk areas positioned between the first bump array and the second bump array, each trunk area to include net lines, each sub-channel to include at least one trunk area of the set of trunk areas. Identifying connector regions to route the net lines between adjacent trunk areas of the set of trunk areas. Assigning, based on layers available for routing, a routing layer to each net line that is to be routed in each respective sub-channel. The method includes routing, based on the assigning, the net lines through the set of trunk areas and the connector regions.

20 Claims, 10 Drawing Sheets

ROUTING OF HIGH-SPEED, HIGH-THROUGHPUT INTERCONNECTS IN INTEGRATED CIRCUITS

RELATED APPLICATIONS

The present application claims the benefit under 35 U.S.C. § 119(e) of U.S. Provisional Patent Application No. 63/239,579 filed Sep. 1, 2021, which is incorporated by this reference herein.

TECHNICAL FIELD

The present disclosure relates to the field of integrated circuit design, and in particular to routing of high-speed, high-throughput interconnects in integrated circuits.

BACKGROUND

Microelectronic dice, also referred to as microelectronic chips, are generally formed on microelectronic substrates, such as silicon wafers. During multi-chip packaging, interconnects are formed between the dice to facilitate signal routing between the multiple dice. Designing electronic die modules that include multiple, interconnected dice typically also involves designing the space and routing for an increasing number of signal interconnects between the multiple dice in multi-chip packing. In some cases, the interconnects are located within one or more interposers that carry the interconnects composed of net lines, which are also referred to as signal lines. The design may be performed using computer-aided design software or the like.

SUMMARY

In one embodiment, a processing device partitions, within an interposer integrated circuit (IC) design on which are disposed a first die and a second die, a first bump array connected to the first die into first cluster regions of bumps and a second bump array connected to the second die into second cluster regions of bumps. The processing device further creates multiple sub-channels between respective bump cluster regions of the first cluster regions and the second cluster regions of bumps. The processing device further identifies a set of trunk areas positioned between the first bump array and the second bump array, each trunk area to include net lines routed in straight lines, each sub-channel of the plurality of sub-channels including at least one trunk area of the set of trunk areas. The processing device further identifies one or more connector regions to route the net lines between adjacent trunk areas of the set of trunk areas. The processing device further assigns, based on a plurality of layers available for routing, a routing layer to each net line that is to be routed in each respective sub-channel of the plurality of sub-channels. The processing device is further to route, based on the assigning, the net lines through the set of trunk areas and the one or more connector regions.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1A:
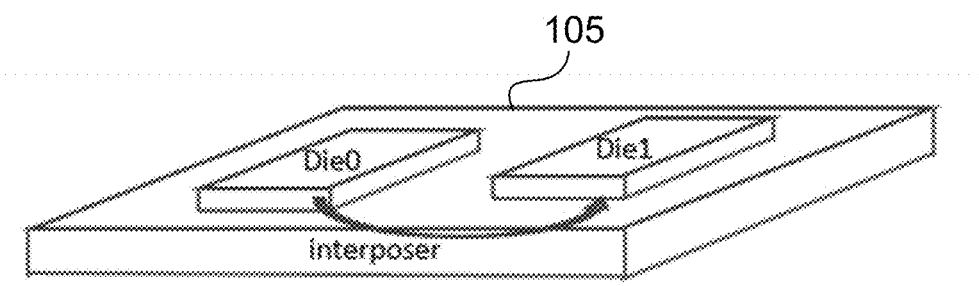
FIGS. 1A-1B are simplified schematic diagrams illustrating two dice that communicate through an interposer IC according to at least some embodiments.

Aspects of the present disclosure relate to computer-driven routing of high-speed, high-throughput interconnects in integrated circuits. Routing of high-speed, high-throughput interconnects such as High-Bandwidth Memory (HBM) interfaces is relied on for proper integrated circuit (IC) inter-die communication and is widely performed in two-and-a-half dimensional (2.5D) and three-dimensional (3D) ICs. Because these interconnects are used to link different dice, these interconnects are often long and placed in parallel, resulting in severe signal interference among net lines that make up the interconnects. For example, a net line can be understood to be a signal line that is connected between two pins or pads and is routed through an interposer with other net lines. Consequently, routing design of these net lines has a stringent demand on the signal integrity quality. In addition, delay matching is often required among the net lines. These and other challenges with routing high-speed, high-throughput interconnects mean that automated routing may still be insufficient and has led some designers to manually route at least some of the groups of net lines through the interconnects. Manual routing of potentially hundreds of thousands of net lines through interconnects is untenable and inefficient.

Due to the above-discussed challenges with such routing, routing style of interconnects can have special characteristics meant to address these routing challenges. For example, routing width and spacing are much wider than the minimal values defined by the fabrication technology. Further, a spacing rule is often not applied uniformly for each individual net line. Less spacing can be used in certain areas whereas wider spacing is used in others. Additionally, special routing patterns are often used. Net lines can be routed in similar topological patterns. Moreover, routes in adjacent layers can be interleaved. Further, although multiple routing layers are available, in order to reduce signal reflection, single-layer routing can be used for the majority of each individual net lines whereas different net lines can be routed on different layers. In addition, net line shielding is often required and thus is considered during the net line routing procedure.

Because of the aforementioned routing criteria (or constraints), conventional automated routing tools do not derive satisfactory routing results, whereas manual routing takes very long time and often suffers from human errors. A computer-driven method for routing of high-speed and high-throughput interconnects for inter-die communication in 2.5D and 3D integrated circuits (IC) is therefore disclosed herein as a solution to overcome the aforementioned routing challenges. A processing device or other processing logic may conduct global net distribution analysis to achieve concurrent routing of multiple net lines. The processing logic can also control the detailed routing features to realize regular routing patterns for minimization of signal interference.

In various embodiments, to perform the routing, the processing device can perform a number of operations. For example, the processing logic can perform routing area partitioning and assigning nets to partitions. Further, the processing logic can derive routing topology based on a floorplan of the ICs, with the consideration of allowable routing angles. Additionally, the processing logic can derive routing layers and perform layer assignment for the net lines. Based on the routing layer and routing area, the processing logic can calculate feasible routing rules, while honoring requirements from users. Further, the processing logic can produce signal routing patterns that allow sufficient space for successful shielding. To assist user design exploration, the processing logic can generate channel analysis reporting that includes routing parameters and statistics.

The present disclosure significantly reduces the time to route high-speed, high-throughput interconnects in 2.5D and 3D ICs, resulting is using fewer computing resources to perform automated routing. Additionally, by performing global net line location analysis and concurrent net line routing, the present disclosure delivers high routing quality in the aspect of signal integrity. The present disclosure offers minimum ramp up to user who may not have prior custom routing experience.

Figure 1B:
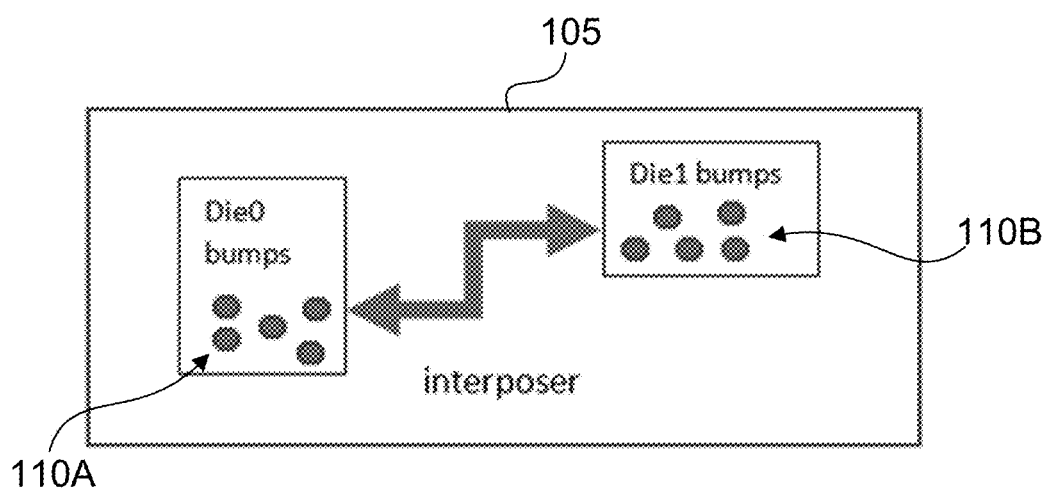

FIGS. 1A-1B are simplified schematic diagrams illustrating two dice (e.g., Die0 and Die1) that communicate through an interposer IC 105 according to at least some embodiments. Any data transfer between the two top dices goes through the interposer IC 105, which is designed to most efficiently route groups of net lines between the two dice. In various embodiments, as illustrated in FIG. 1B, each die includes an array of bumps, e.g., solder bumps, metal bumps, or conductive adhesive bumps provided by each die for input/output (I/O) connections. For example, a first die (Die0) of the two dice can include a first bump array 110A and a second die (Die1) of the two dice can include a second bump array 110B. There are corresponding bump arrays (not shown) on the interposer die at the same locations as those bump arrays on the two dice, forming physical connections between the interposer and each of the two dice, respectively. The present disclosure can most efficiently route net lines of two or more pin nets between bumps in the two bump arrays on the interposer IC 105.

Figure 2:
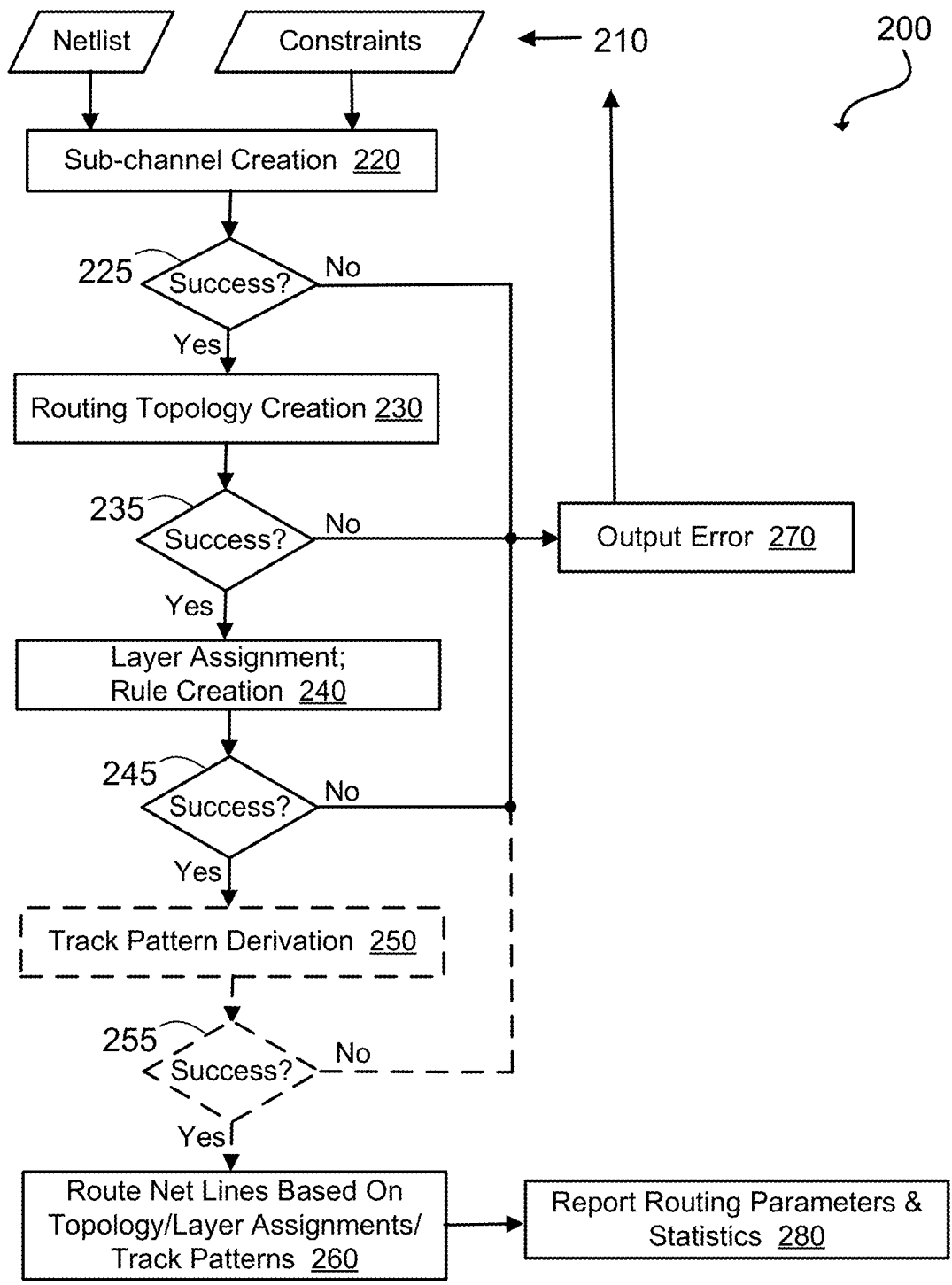
FIG. 2 is a flowchart of a method for computer-driven routing of high-speed, high-throughput interconnects in ICs according to at least some embodiments.

FIG. 2 is a flowchart of a method 200 for computer-driven routing of high-speed, high-throughput interconnects in ICs according to at least some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the computer system 1000, to include the processing device 1002, of FIG. 10. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives or retrieves one or more netlists and other constraints. As will be discussed in more detail, a netlist can include the net lines to be routed between the first bump array 110A (or first input/output (I/O) connection array) connected to the first die and the second bump array 110B (or second I/O connection array) connected to the second die of the two dice of FIGS. 1A-1B. The netlist can therefore also include existing pre-route locations or bump locations at which net lines originate, which the processing logic can incorporate into partitioning a first bump array of a first die and a second bump array of a second die. The constraints can include different routing rules, algorithms, and user-provided routing constraints that can be integrated into the execution of instructions or operations performed by the processing logic.

At operation 220, the processing logic creates sub-channels. To do so, the processing logic partitions, within the interposer on which are disposed the first die and the second die, a first bump array connected to the first die into first cluster regions of bumps and a second bump array connected to the second die into second cluster regions of bumps. The processing logic further identifies, distinguishes, and/or creates multiple sub-channels between identically-numbered cluster regions of the first cluster regions and the second cluster regions of bumps (or of I/O connections). The routing of sub-channels, which will be discussed in more detail, can be performed separately or in parallel. Operation 220 will be discussed in more detail with referenced to FIGS. 3-4 and FIGS. 7A-7B.

At operation 225, the processing logic determines whether the sub-channels were successfully created. If not, at operation 270, the processing logic outputs an error. If yes, the method 200 continues on to the next routing operation.

At operation 230, the processing logic creates a routing topology. More specifically, the processing logic identifies a set of trunk areas positioned between the first bump array and the second bump array, where each trunk area of the set of trunk areas can include net lines routed in straight lines, and each sub-channel of the multiple sub-channels include at least one trunk area of the set of trunk areas. A trunk or trunk area can, therefore, be understood to be a net line routing region. The processing logic also identifies one or more connector regions to route the net lines between adjacent trunk areas of the set of trunk areas. In at least one embodiment, the processing logic selects, based on bump array offsets, one of a 3-stage or 5-stage routing topology, where a 3-stage routing topology includes two trunk areas and a connector region, and a 5-stage routing topology includes three trunk areas and two connector regions. Operation 230 will be discussed in more detail with reference to FIG. 5 and FIGS. 6A-6B.

At operation 235, the processing logic determines whether the routing topology creation was successful. If not, at operation 270, the processing logic outputs an error. If yes, the method 200 continues on to the next routing operation.

At operation 240, the processing logic performs layer assignments and rule creation associated within routing. More specifically, the processing logic assigns, based on multiple layers available for routing within the interposer, a routing layer to each net line that is to be routed in each respective sub-channel of the multiple sub-channels. One example of a rule includes determining maximum pitches between net lines for routing within each respective trunk area and connector region. Such maximization of pitches reduces cross-net line interference as much as possible. In at least one embodiment, the processing logic determines, based on the channel length and routing topology, the maximum feasible routing pitches in different routing stages, e.g., trunk areas and connection regions. Operation 240 will be discussed in more detail with reference to FIGS. 7A-7B.

At operation 245, the processing logic determines whether the layer assignments and rule creation were successful. If not, at operation 270, the processing logic outputs an error. If yes, the method 200 continues on to the next routing operation.

At operation 250, the processing logic optionally derives a track pattern for routing the net lines through the trunk areas and the one or more connector regions. More specifically, the processing logic can place routes on different layers in staggered or inline patterns, leaving enough space for shielding, as will be discussed in more detail. In at least one embodiment, the processing logic determines, based on routing pitch and channel area, the number of layers needed for the net line routing. Operation 250 will be discussed in more detail with reference to FIG. 8.

At operation 255, the processing logic determines whether the track pattern derivation was successful. If not, at operation 270, the processing logic outputs an error. In various embodiments, if at any time an error is output by the processing logic, the method can loop back to the beginning to be rerun, e.g., after the netlist and/or the constraints are updated in order to address the reason for the error. If yes, at operation 255, the method 200 continues on to the next routing operation.

At operation 260, assuming successful completion of the routing design operations discussed above, the processing logic routes the net lines, e.g., based on the topology that was created with reference to individual sub-channels, based on the assignments of the layers to respective sub-channels, and based on the track patterns derived for the routing. This routing can be seen as the application of actual routing outputs that result from the various successful routing design steps in operations 210 through 250. In some embodiments, the routing includes enforcing a routing pattern in routing at least some of the net lines across respective layers of a plurality of layers of the interposer IC 105, e.g., the interposer integrated circuit design, as will be discussed in more detail with reference to FIGS. 7A-7B and FIG. 8.

At operation 280, the processing logic outputs routing parameters and statistics, e.g., to a user interface or other I/O-based output discussed with reference to FIG. 10. The routing parameters and/or statistics can include maximal routing length and maximal routing length variations and other metrics by which a user can check, refine, and/or reuse routing design(s) for future routing to be performed by the processing logic.

Figure 3:
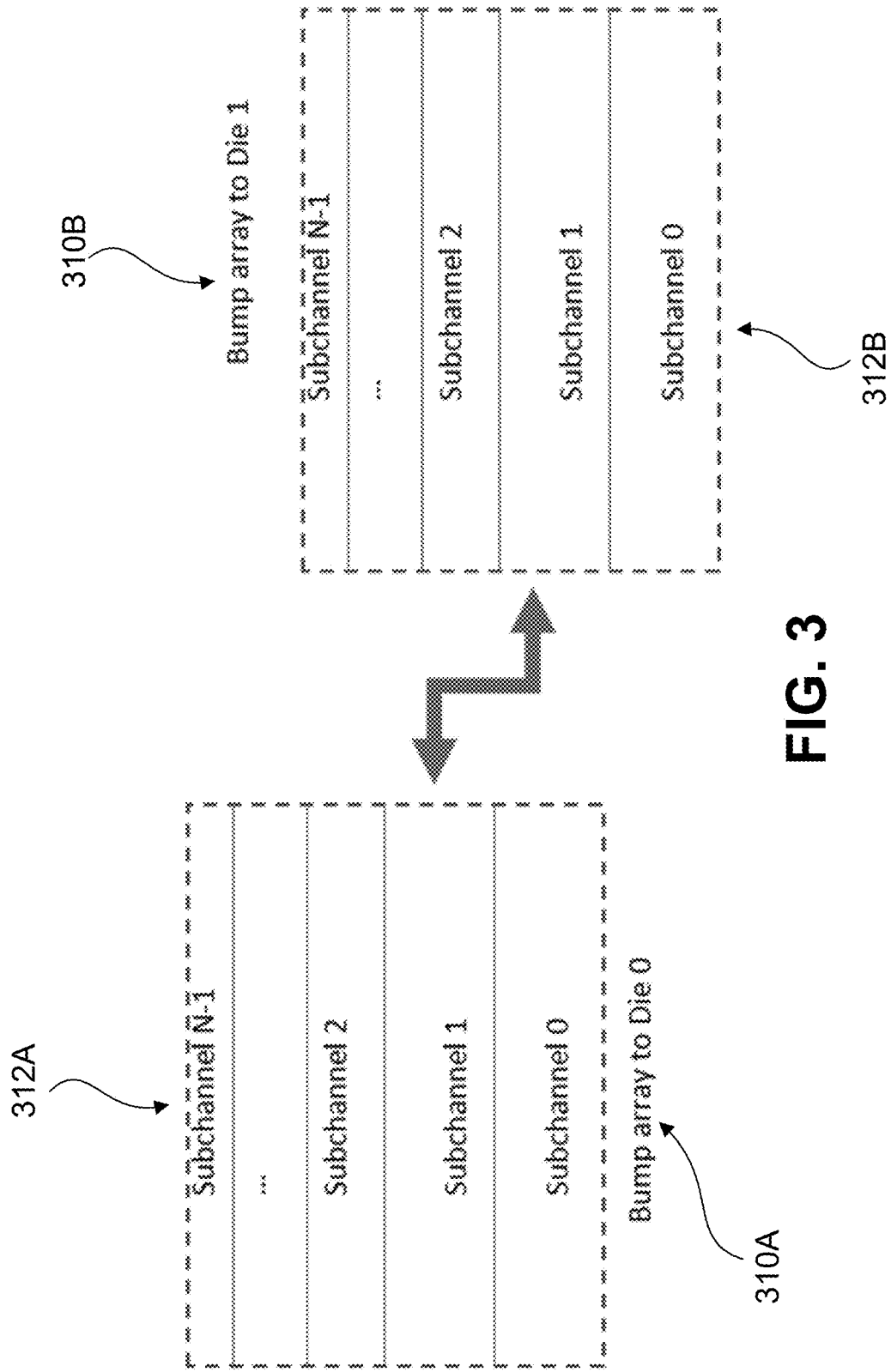
FIG. 3 is a simplified schematic diagram of sub-channel creation between a first bump array to a first die and a second bump array to a second die according to at least some embodiments.

FIG. 3 is a simplified schematic diagram of sub-channel creation between a first bump array 310A to a first die (Die0) and a second bump array 310B to a second die (Die1) according to at least some embodiments. As illustrated in FIG. 1B, the net lines to be routed connect bumps in bump arrays to the two dice. These bumps are expected to be placed in cluster regions within the bump arrays 110A or 310A and 110B or 310B that are located at the positions where the dice are disposed on the interposer IC 105.

The first step of routing can include dividing the bump cluster regions into non-overlapping slices called sub-channels. More specifically, a processing device can partition, within the interposer IC 105 on which are disposed the first die and the second die, the first bump array 310A connected to the first die into first cluster regions of bumps and the second bump array 310B connected to the second die into second cluster regions of bumps. The processing device can further create multiple sub-channels 312A and 312B between respective bump cluster regions of the first cluster regions and the second cluster regions of bumps, respectively. Thus, the first bump array 310A and the second bump array 310B can each be divided into an equal number of bump cluster regions.

In at least some embodiments, the channel orientation is as the orientation of die placement illustrated in FIG. 3. Namely, if the two dice are placed next to each other horizontally, the sub-channels can be oriented horizontally between the two dice. Similarly, if the two dice are placed next to each other vertically, the sub-channels can be oriented vertically between the two dice. The partitioning can be performed based on either the existing pre-route locations within the bump array regions (FIG. 4) or based on bump locations.

Figures 4A, 4B:
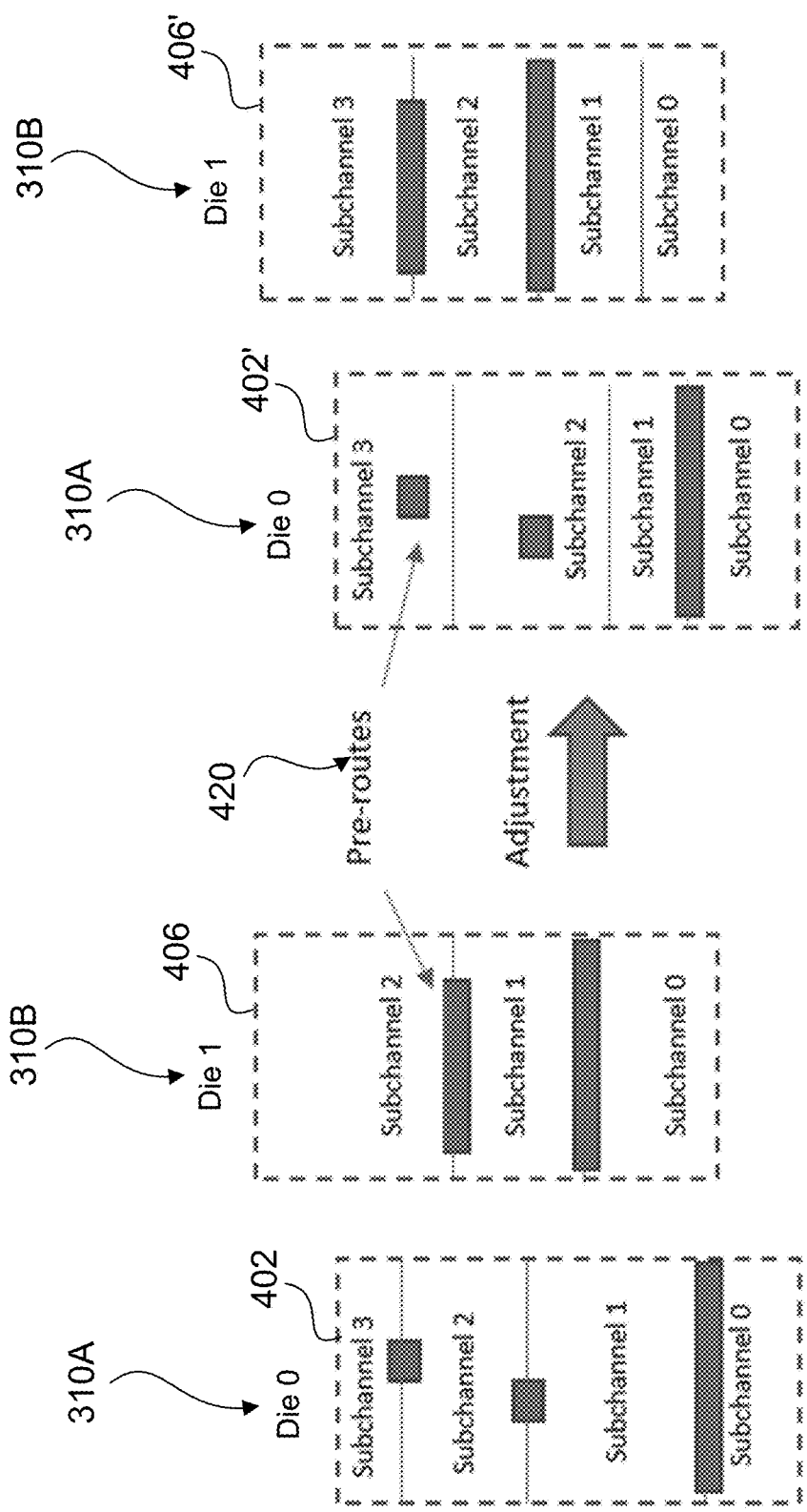
FIGS. 4A-4B are simplified schematic diagrams illustrating creation and adjustment of multiple sub-channels based on sub-channel pre-routes according to at least some embodiments.

FIGS. 4A-4B are simplified schematic diagrams illustrating creation and adjustment of multiple sub-channels based on sub-channel pre-routes according to at least some embodiments. In the embodiment of FIG. 4A, sub-channels are divided at the pre-route locations 420, e.g., the pre-route locations 420 are positioned at boundaries of the bump cluster regions that correspond to multiple sub-channels.

In various embodiments, if the sub-channel counts are different for the two bump cluster regions, which is illustrated in FIG. 4A where a first cluster region 402 of bumps has four sub-channels and the second cluster region 406 of bumps has three sub-channels, the processing device adjusts the sub-channels as illustrated in FIG. 4B. For example, sub-channel 3 is added to the bump cluster regions overlapping the second die so that either bump region includes the same number of sub-channels. More specifically, the sub-channel 3 is added to an adjusted second cluster region 406' of bumps.

Further, the sizes of the bump cluster regions corresponding to the respective channels can be re-sized so that each identically-numbered bump cluster region corresponding to each of the two dice can fit approximately the same number of net lines. Further, it can be observed that two of the pre-route locations identified within the adjusted first cluster region 402' are not at bump cluster region boundaries, e.g., to conform the sub-channels across the two dice, it is acceptable to have some pre-route locations 420 not at the bump cluster region boundaries. In at least some embodiments, if no pre-routes 420 exist in the routing area of the bump arrays, bump locations can be used to create sub-channels. Each sub-channel may contain approximately the same number of bumps.

In various embodiments, the net lines are assigned to sub-channels for routing. Namely, the net lines assigned to a sub-channel are routed within the assigned sub-channel. In at least some embodiments, the assignment is identical for the corresponding sub-channel within the two bump regions of the first and second bump arrays 310A and 310B. For example, the two sub-channel 0's in both bump arrays contain the same sets of net lines, the two sub-channel 1's in both bump arrays contain the same sets of net lines, and so forth.

Figure 5:
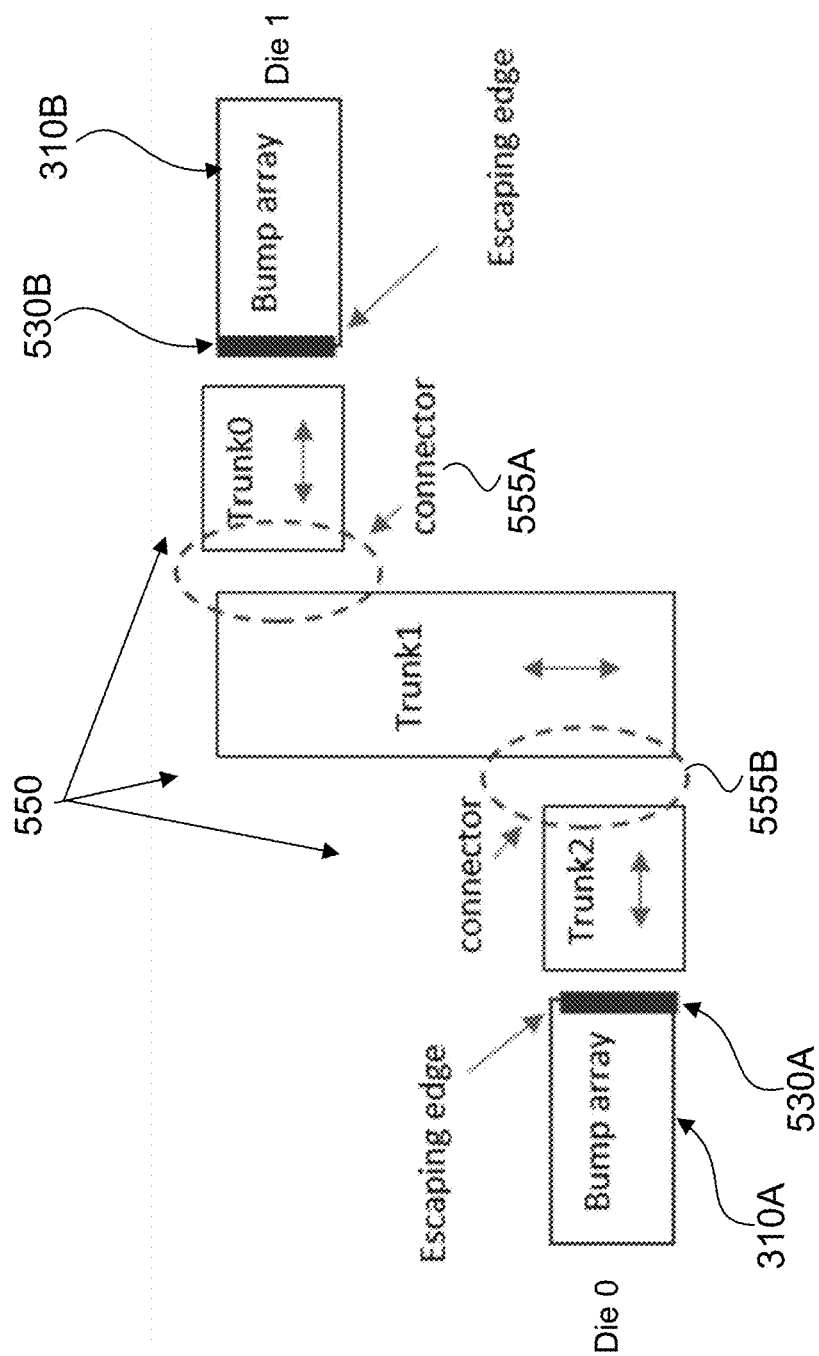
FIG. 5 is a simplified schematic diagram illustrating creation of trunk pattern routing according at least some embodiments.

FIG. 5 is a simplified schematic diagram illustrating creation of trunk pattern routing according at least some embodiments. As illustrated in FIG. 3, interconnects can be divided into groups of bumps, e.g., bump cluster regions, and routed in the corresponding sub-channels. In the area between the bump arrays, the processing device can route all nets as buses in regular routing patterns. The selection of patterns can be based on the placement and orientation of bump arrays. Specifically, the processing device can first identify the escaping edge of each bump array, as illustrated in FIG. 5, e.g., a first escaping edge 530A from the first bump array 310A associated with the first die (Die0) and a second escaping edge 530B from the second bump array 310B associated with the second die (Die1).

In various embodiments, one edge of the rectangular bounding box of the corresponding bump array is chosen. In the example of FIG. 5, the right edge of the bump array box overlapping the first die is selected while the left edge of the bump array box overlapping the second die is selected as the escaping edges 530A and 530B, respectively. The routing pattern starts and ends with the perpendicular directions with respect to the corresponding escaping edges 530A and 530B. The routing pattern may contain a linear sequence of routing trunk areas 550 (or net line routing regions). The trunk areas 550 can be either vertical or horizontal, and can generally be identified as a two-dimensional area with reference to a top view of the respective bump arrays. The net lines are routed in straight lines inside the trunk areas 550.

In various embodiments, the trunk areas 550 can be joined by connectors within connection regions that are identified to connect each trunk area to an adjacent trunk area, e.g., a first connector 555A between Trunk0 and Trunk1 and a second connector 555B between Trunk1 and Trunk2. Net lines in the connector regions can also be routed in parallel. However, the net line orientation can be of any angles, e.g., 30 degrees, 45 degrees, or the like, depending on the fabrication technology. The example of FIG. 5 shows an example of trunk routing in which three trunks are used with two connectors, although other combinations of trunks and connectors are envisioned.

In some embodiments, a user provides the trunk routing topology, e.g., as an input criteria or set of constraints. If the topology is not provided, the processing device analyzes the routing region between the escaping edges (e.g., 530A and 530B), identifies two or more generally 2D areas where net lines can be routed in straight lines, and creates the trunk and connector routing topologies based on geometric space analysis, including measuring and calculating geometric regions within the routing region between the two dice (Die0 and Die1).

Figure 6B:
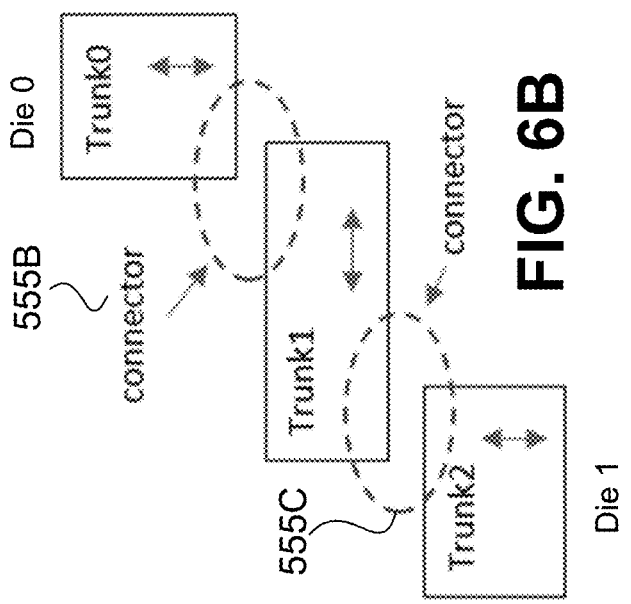
FIGS. 6A-6B are simplified schematic diagrams illustrating trunk routing topology examples according to at least some embodiments.
Figure 6A:
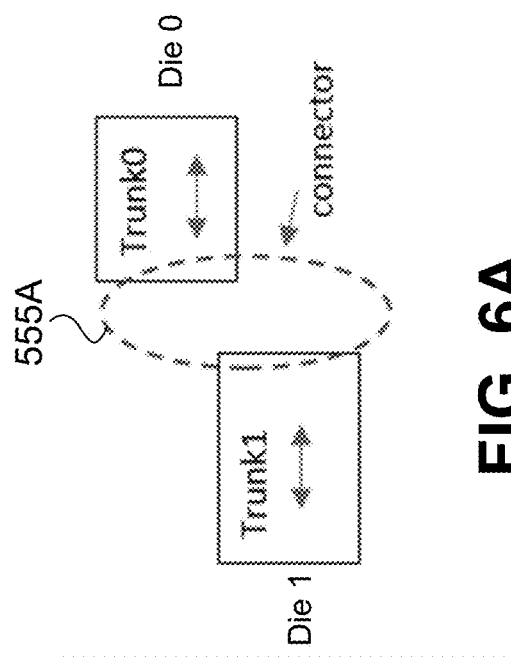

FIGS. 6A-6B are simplified schematic diagrams illustrating trunk routing topology examples according to at least some embodiments. In at least some embodiments, FIG. 6A illustrates an example in which two trunk areas (Trunk0 and Trunk1), which are horizontally oriented between two dice, are connected by a connector region 555A (e.g., by a connector). Further, in these embodiments, FIG. 6B illustrates an example with three trunk areas, including a first trunk area (Trunk0), a second trunk area (Trunk1), and a third trunk area (Trunk2). In this example, Trunk0 and Trunk2 are vertically oriented and Trunk1 is horizontally oriented. These three trunk areas are connected by two connector regions. For example, a first connector region 555B is positioned between the first trunk area (Trunk0) and the second trunk area (Trunk1), and a second connector region 555C is positioned between the second trunk area (Trunk1) and a third trunk area (Trunk2).

Figure 7B:
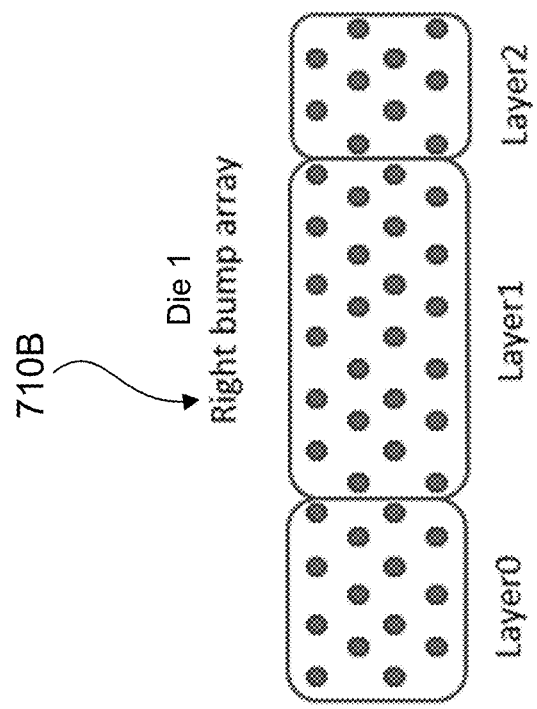
FIGS. 7A-7B are simplified schematic diagrams illustrating bump partitioning for routing layers according to at least some embodiments.
Figure 7A:
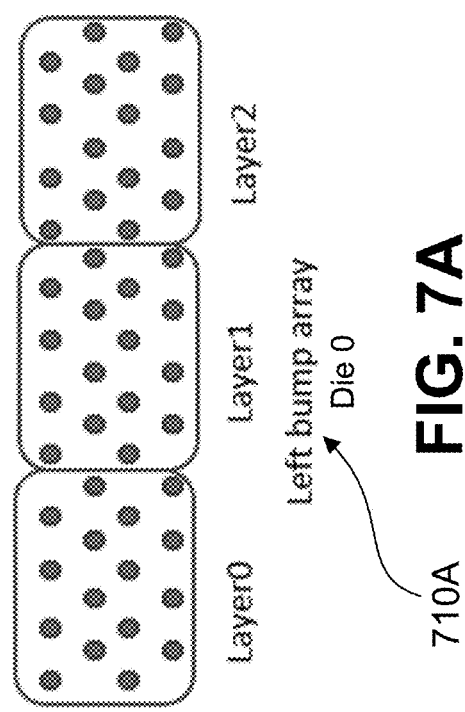

FIGS. 7A-7B are simplified schematic diagrams illustrating bump partitioning for routing layers according to at least some embodiments. Depending on the number of layers used for the routing, the processing device assigns a routing layer to each net line. This layer assignment can be performed for each sub-channel. Specifically, the processing device derives the maximum possible number of net lines that can be routed on each layer based on routing area, including routing area dimension and possible pre-routes inside the routing area, and routing pitch provided by users (or user inputs). The processing device can split the bumps of a sub-channel into multiple bump cluster regions. Net lines connected to bumps inside each bump cluster region can be routed on the same layer.

The example of FIGS. 7A-7B illustrate the creation of bump cluster regions that correspond to a sub-channel and each respective layer, as illustrated. The bump cluster regions can be disjoint and do not have to be the same size. For example, FIG. 7A illustrates the bumps in a first bump array 710A connected to a first die (Die0), whose nets are assigned to the sub-channel. The bumps are partitioned into three bump cluster regions to which are assigned layer zero (Layer0), layer one (Layer1), and layer two (Layer2) for routing. Further by way of example, FIG. 7B illustrates the bumps in a second bump array 710B connected to the second die (Die1) whose nets are routed in the sub-channel. These bumps are partitioned into three bump cluster regions to which are also assigned layers layer zero (Layer0), layer one (Layer1), and layer two (Layer2) for routing, thus being routed on the same layers, respectively, as the bumps in the first bump array.

One advantage of trunk pattern routing is that the processing logic can seamlessly maximize the route pitch for each individual trunk area and connector region. Specifically, this processing device can derive the maximum width of each trunk area first. The processing device can then calculate the maximum possible net-line pitch based on the number of net lines to be routed and the trunk area dimension. Selecting large pitch routing values can improve the signal integrity quality of the routing result.

Figure 8:
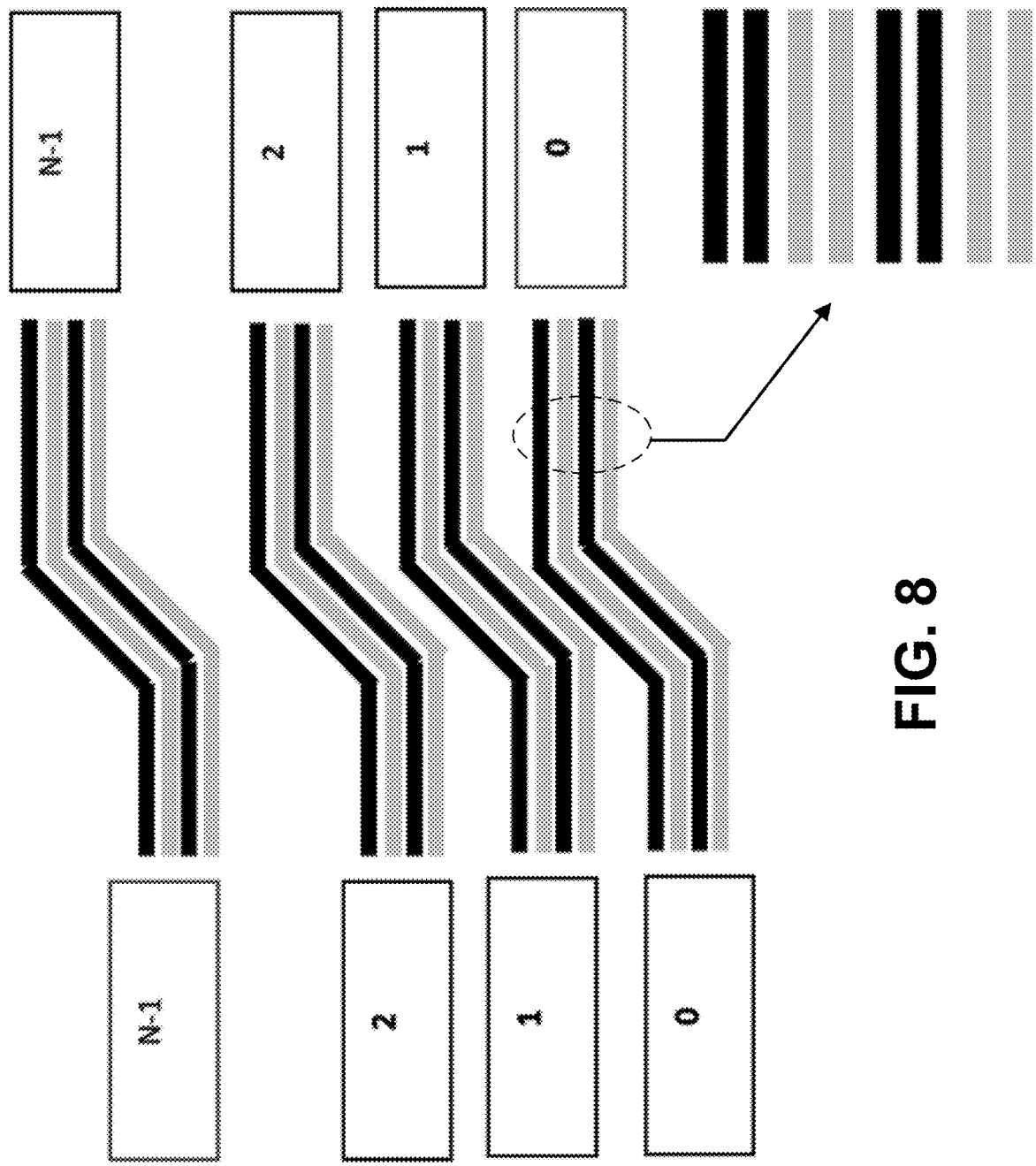
FIG. 8 is a schematic diagram of a portion of net line routing with staggered track patterns on multiple layers according to at least some embodiment.

FIG. 8 is a schematic diagram of a portion of net line routing with staggered track patterns on multiple layers according to at least some embodiment. Coaxial shielding is often applied to improve the signal integrity of bus routing, e.g., routing of groups of net lines. To apply coaxial shielding, net lines routed on different layers can be placed in certain patterns. The processing device takes shielding into consideration during the signal routing of the net lines. Because routing on all layers share the same trunk area, tracks on different layers inside each trunk area can be placed to honor any patterns such as staggered patterns.

In an embodiment, FIG. 8 illustrates an example of staggered routing tracks. The routing topology contains two horizontal trunks for each sub-channel. The layers are represented by different-weighted lines. Inside each trunk area, the routes on different layers can be aligned with a half pitch offset. For example, the net lines on at least a first layer can have a pitch offset compared to net lines on at least a second layer of multiple layers used for routing. Any routing patterns specified by users (e.g., as input constraints) can be honored. In the exploded view of FIG. 8, a two-track staggered pattern is shown that can be employed instead. The computer system 1000 can employ a user interface (e.g., illustrated on the video display unit 1010 of FIG. 10) for the description of routing patterns and/or pitch offsets and/or other outputs to users to describe such routing patterns and/or pitch offsets.

The user interface can also be employed for design exploration and routing result improvement. Specifically, routing parameters such as sub-channel partitions, net assignment, route spacing, net layer assignment, are reported so that users can review and modify them during next routing run to improve the routing result. Moreover, routing result statistics such as maximal wire length and maximal route length variation are reported as quality metrics.

Figure 9:
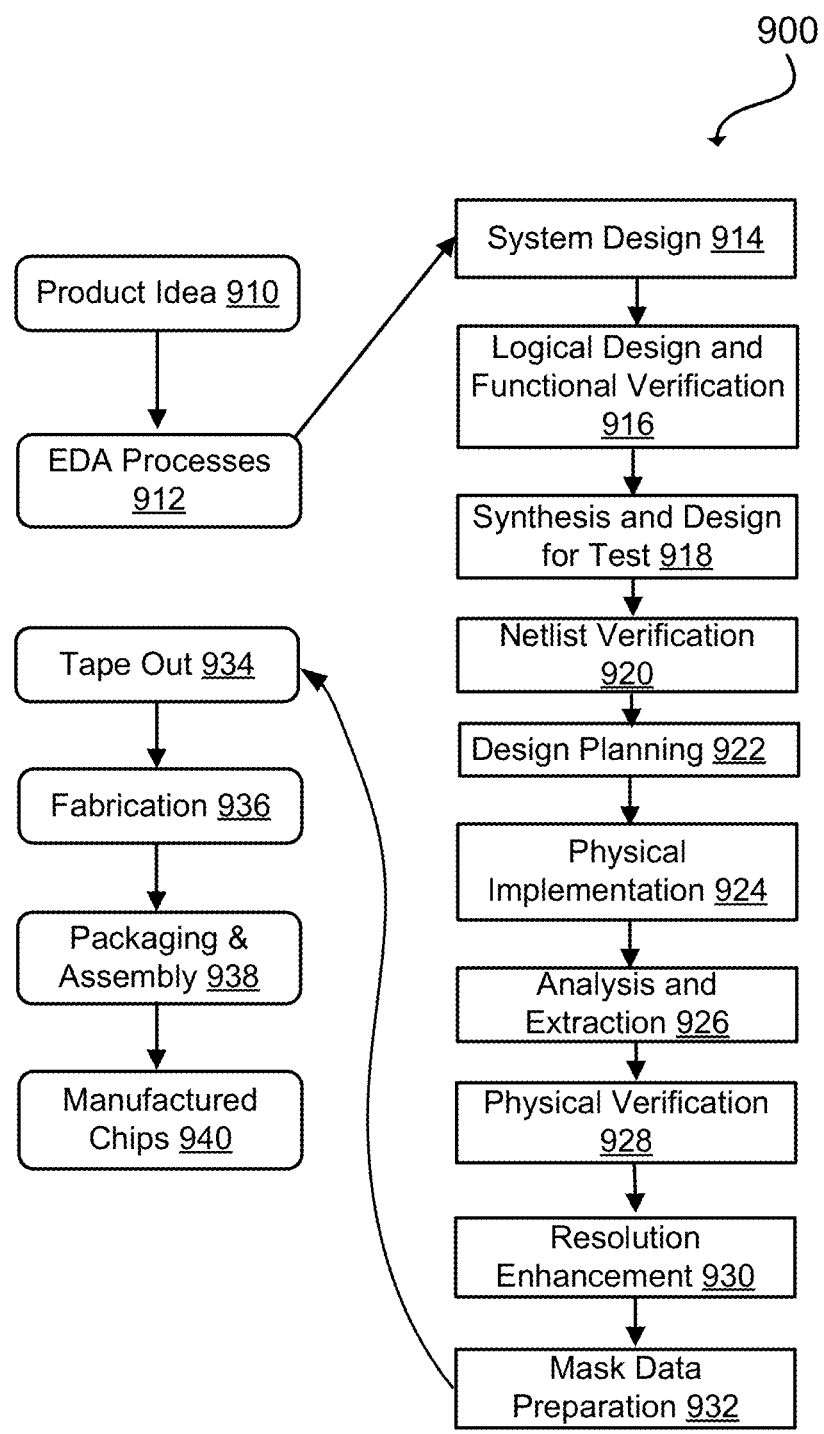
FIG. 9 is a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 9. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
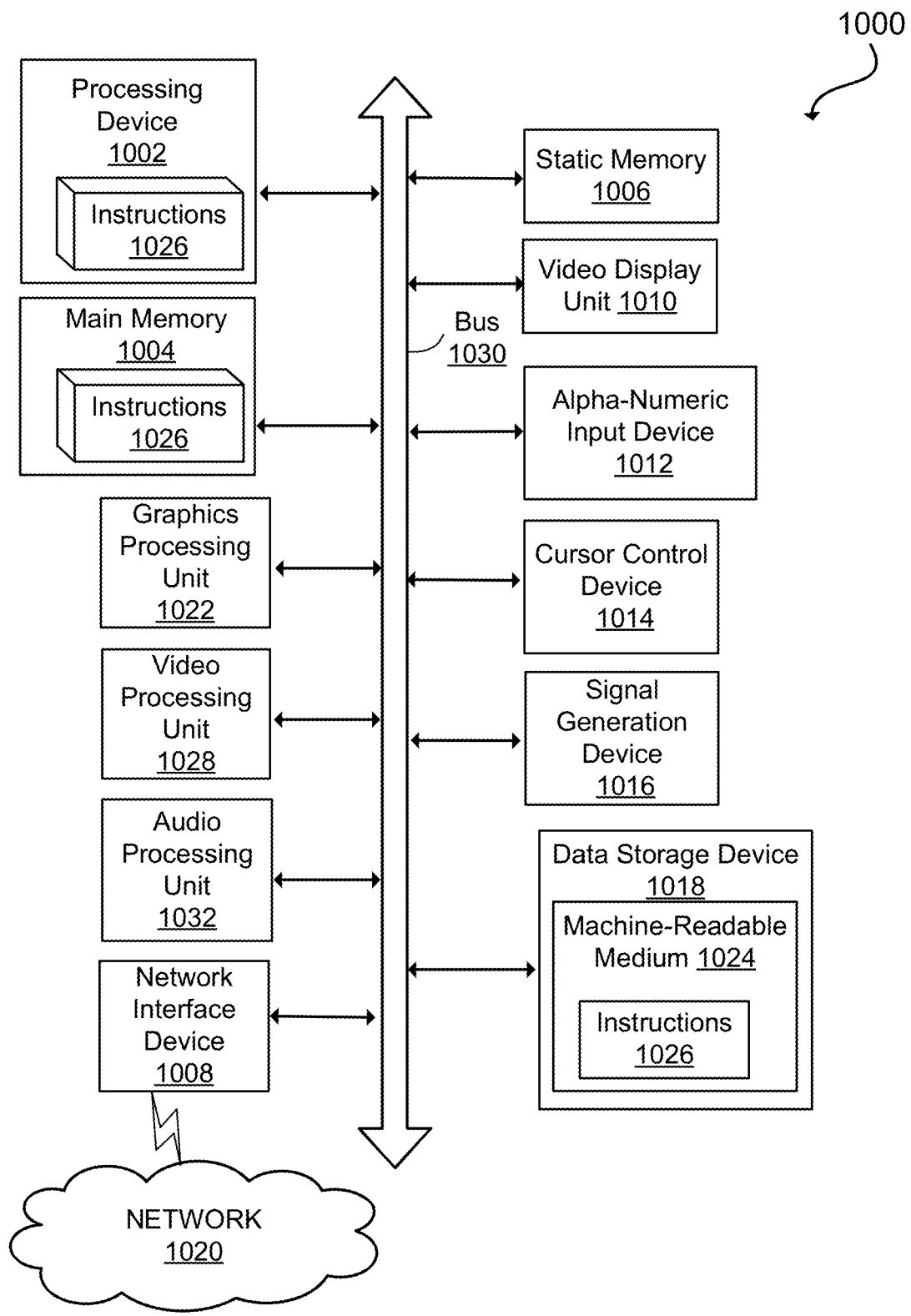
FIG. 10 is a system diagram of an example computer system in which embodiments of the present disclosure may operate.

FIG. 10 illustrates an example machine of a computer system 1000 (or computing system) within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030. This memory (either or both of the main memory 1004 and the data storage device 1018) can store constraints (or other criteria) associated with routing net lines within an interposer integrated circuit design on which is disposed a first die and a second die, as discussed herein.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable storage medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
partitioning within an interposer integrated circuit design on which are disposed a first die and a second die, a first bump array connected to the first die into first cluster regions of bumps and a second bump array connected to the second die into second cluster regions of bumps;
creating multiple sub-channels between respective bump cluster regions of the first cluster regions and the second cluster regions of bumps;
identifying a set of trunk areas positioned between the first bump array and the second bump array, each trunk area to include net lines, and each sub-channel of the multiple sub-channels to include at least one trunk area of the set of trunk areas;
identifying one or more connector regions to route the net lines between adjacent trunk areas of the set of trunk areas;
assigning, by a processing device and based on a plurality of layers available for routing, a routing layer to each net line that is to be routed in each respective sub-channel of the multiple sub-channels; and
routing, based on the assigning, the net lines through the set of trunk areas and the one or more connector regions.

2. The method of claim 1, wherein the net lines in each trunk area are straight, and wherein the set of trunk areas is at least one of horizontally or vertically oriented between the first die and the second die.

3. The method of claim 1, wherein the routing further comprises enforcing a routing pattern in routing at least some of the net lines across respective layers of the plurality of layers.

4. The method of claim 1, wherein the partitioning the first bump array and the second bump array is based on a plurality of pre-route locations.

5. The method of claim 1, wherein the identifying the multiple sub-channels is as between identically-numbered cluster regions of the first cluster regions and the second cluster regions of bumps.

6. The method of claim 1, wherein the identifying the set of trunk areas and the one or more connector regions for routing further comprises maximizing a width of each trunk area of the set of trunk areas and of each connector region of the one or more connector regions.

7. The method of claim 1, further comprising maximizing a route pitch between the net lines routed within each of the set of trunk areas and each of the one or more connector regions, respectively.

8. A computing system comprising:
a memory to store constraints associated with routing net lines within an integrated circuit design on which is disposed a first die and a second die; and
a processing device coupled to the memory, the processing device to employ the constraints to:
partition, within the integrated circuit design, a first input/output (I/O) connection array connected to the first die into first cluster regions of I/O connections and a second I/O connection array connected to the second die into second cluster regions of I/O connections;
create multiple sub-channels between respective I/O connection cluster regions of the first cluster regions and the second cluster regions of I/O connections;
identify a set of net line routing regions positioned between the first I/O connection array and the second I/O connection array, each sub-channel of the multiple sub-channels to include at least one net line routing region of the set of net line routing regions;
identify one or more connector regions to route the net lines between adjacent net line routing regions of the set of net line routing regions;
assign, based on a plurality of layers available for routing, a routing layer to each net line that is to be routed in each respective sub-channel of the multiple sub-channels; and
route, based on the assigning, the net lines through the set of net line routing regions and the one or more connector regions.

9. The computing system of claim 8, wherein the net lines in each net line routing region are straight, and wherein the set of net line routing regions is at least one of horizontally or vertically oriented between the first die and the second die.

10. The computing system of claim 8, wherein to route the net lines, the processing device is further to enforce a routing pattern in routing at least some of the net lines across respective layers of the plurality of layers, wherein the net lines on at least a first layer are aligned with a pitch offset compared to net lines of at least a second layer of the plurality of layers.

11. The computing system of claim 8, wherein to partition the first I/O connection array and the second I/O connection array, the constraints comprises a plurality of pre-route locations that the processing device incorporates into partitioning the first I/O connection array and the second I/O connection array.

12. The computing system of claim 8, wherein to identify the multiple sub-channels, the processing device is to distinguish between identically-numbered cluster regions of the first cluster regions and the second cluster regions of I/O connections.

13. The computing system of claim 8, wherein to identify the set of net line routing regions and the one or more connector regions for routing, the processing device is to maximize a width of each net line routing region of the set of net line routing regions and of each connector region of the one or more connector regions.

14. The computing system of claim 8, wherein the processing device is further to maximize a route pitch between the net lines routed within each of the set of net line routing regions and each of the one or more connector regions, respectively.

15. A non-transitory computer-readable storage medium storing instructions, which when executed, cause a processing device to perform a plurality of operations comprising:
   partitioning, within an interposer integrated circuit design on which are disposed a first die and a second die, a first bump array connected to the first die into first cluster regions of bumps and a second bump array connected to the second die into second cluster regions of bumps;
   creating multiple sub-channels between respective bump cluster regions of the first cluster regions and the second cluster regions of bumps;
   identifying a set of trunk areas positioned between the first bump array and the second bump array, each trunk area to include net lines, and each sub-channel of the multiple sub-channels to include at least one trunk area of the set of trunk areas;
   identifying one or more connector regions to route the net lines between adjacent trunk areas of the set of trunk areas;
   assigning, based on a plurality of layers available for routing, a routing layer to each net line that is to be routed in each respective sub-channel of the multiple sub-channels; and
   routing, based on the assigning, the net lines through the set of trunk areas and the one or more connector regions.

16. The non-transitory computer-readable storage medium of claim 15, wherein the net lines in each trunk area are straight, the set of trunk areas is at least one of horizontally or vertically oriented between the first die and the second die, and wherein the routing further comprises enforcing a routing pattern in routing at least some of the net lines across respective layers of the plurality of layers.

17. The non-transitory computer-readable storage medium of claim 15, wherein the partitioning the first bump array and the second bump array is based on a plurality of pre-route locations.

18. The non-transitory computer-readable storage medium of claim 15, wherein the identifying the multiple sub-channels is as between identically-numbered cluster regions of the first cluster regions and the second cluster regions of bumps.

19. The non-transitory computer-readable storage medium of claim 15, wherein the identifying the set of trunk areas and the one or more connector regions for routing further comprises maximizing a width of each trunk area of the set of trunk areas and of each connector region of the one or more connector regions.

20. The non-transitory computer-readable storage medium of claim 15, wherein the plurality of operations further comprise maximizing a route pitch between the net lines routed within each of the set of trunk areas and each of the one or more connector regions, respectively.

\* \* \* \* \*